United States Patent
Hsieh (10) Patent No.: US 6,784,039 B2
(45) Date of Patent: Aug. 31, 2004

(54) METHOD TO FORM SELF-ALIGNED SPLIT GATE FLASH WITH L-SHAPED WORDLINE SPACERS

(75) Inventor: Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 112 days.

(21) Appl. No.: 10/272,086

(22) Filed: Oct. 16, 2002

(65) Prior Publication Data

US 2004/0077144 A1 Apr. 22, 2004

(51) Int. Cl.⁷ .......................................... H01L 21/8238
(52) U.S. Cl. ...................................... 438/201; 257/315
(58) Field of Search .............................. 438/251, 201, 438/266–267, 211, 594, 275; 257/314, 315, 261

(56) References Cited

U.S. PATENT DOCUMENTS

| | | | |
|---|---|---|---|
| 6,143,606 A | 11/2000 | Wang et al. ................ 438/257 |
| 6,204,126 B1 | 3/2001 | Hsieh et al. ................ 438/267 |
| 6,271,088 B1 | 8/2001 | Liu et al. .................... 438/259 |
| 6,312,989 B1 | 11/2001 | Hsieh et al. ................ 438/257 |
| 6,541,324 B1 * | 4/2003 | Wang ......................... 438/201 |
| 6,593,187 B1 * | 7/2003 | Hsieh ......................... 438/257 |
| 6,706,592 B2 * | 3/2004 | Chern et al. ................ 438/257 |

* cited by examiner

*Primary Examiner*—David Nelms
*Assistant Examiner*—David Vu
(74) *Attorney, Agent, or Firm*—George O. Saile; Stephen B. Ackerman; Douglas R. Schnabel (57) ABSTRACT

A new method to form split gate flash memory cells in the manufacture of an integrated circuit device is achieved. The method comprises providing a substrate. Pairs of floating gates are formed overlying the substrate. Common source plugs are formed overlying the substrate and filling spaces between the floating gate pairs. An oxide layer is formed overlying the substrate, the floating gates, and the common source plugs. A conductor layer is deposited overlying the oxide layer. First dielectric spacers are formed on vertical surfaces of the conductor layer. The conductor layer is etched through where not covered by the first dielectric spacers to thereby form word line gates adjacent to the floating gates. Second dielectric spacers are formed on vertical surfaces of the word line gates and the first dielectric spacers to complete the split gate flash memory cells.

20 Claims, 10 Drawing Sheets

METHOD TO FORM SELF-ALIGNED SPLIT GATE FLASH WITH L-SHAPED WORDLINE SPACERS

BACKGROUND OF THE INVENTION (1) Field of the Invention

The invention relates to a method to form a split gate, flash memory cell, and, more particularly, to a split gate, flash memory cell having an L-shaped word line gate with improved process capability.

(2) Description of the Prior Art

Flash memory is an improved version of electrically erasable, programmable read-only memory (EEPROM) which is capable of block-by-block erasing. Flash memory is used in many applications that require programmability with no loss of memory data during power down.

A flash memory transistor comprises a floating gate and a control, or word line, gate. The state of the flash memory transistor is programmed by charging or discharging the floating gate through a control gate. The charge-state of the floating gate, in turn, controls the threshold voltage of the cell transistor. The word line gate can be used to couple a large voltage onto the floating gate for programming or erasing. During a transistor read, a reading voltage is forced onto the word line gate. The presence or absence of drain current is then used to determine the state of the transistor.

A particular form of a flash transistor that is known in the art as a split gate flash. In a split gate flash, the word line gate is formed to both couple voltage onto the floating gate and to control a channel region of the transistor. To accomplish this, the word line gate is physically formed directly overlying the substrate and overlying, or next to, the floating gate. By comparison, a stacked gate flash comprises a word line gate overlying a floating gate where only the floating gate directly overlies the substrate channel. The split gate flash exhibits an improved performance over the stacked gate flash. Specifically, the split gate flash can be constructed to prevent over erasing that occurs in the stacked gate flash.

Figure 1:
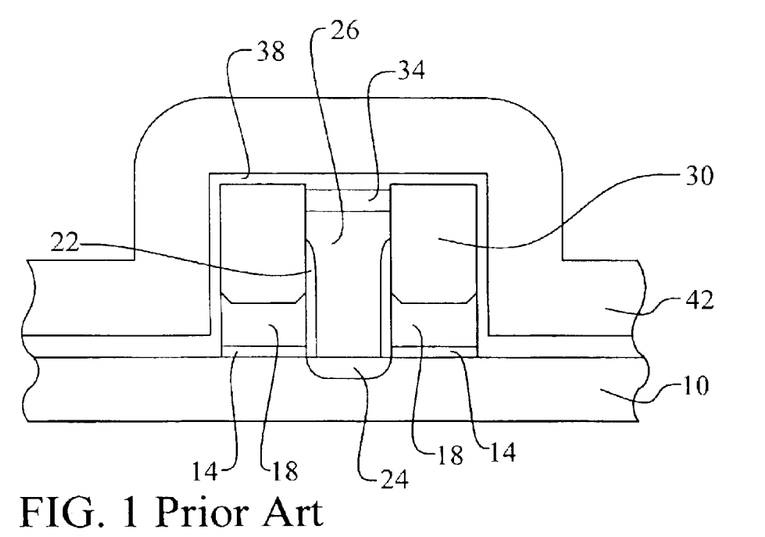
FIGS. 1 through 4 illustrate a split gate, flash cell of the prior art.

Referring now to FIGS. 1 through 4, a split gate, flash cell of the prior art is illustrated. Referring first to FIG. 1, a partially completed flash memory cell is shown. It is typical in the art to form a flash cell comprising a pair of transistors. In this case, the transistors are configured to share a common source region 24. The flash cell, at this point in the fabrication process, comprises a substrate 10. A pair of floating gates is formed overlying the substrate 10. The floating gates each comprise a polysilicon layer 18 overlying a gate oxide layer 14. A source plug 26 is used in this example to contact the source region 24. The source plug 26 comprises a conductive material and is isolated from the floating gate polysilicon 18 by an oxide layer 22. Additional oxide layers 30 and 34 create a composite barrier comprising the floating gate pair 18 and 14 and the source plug 26. A dielectric layer 38 is formed overlying the floating gates 30, 18, and 14, and the source plug 34 and 26. A second polysilicon layer 42 is then deposited overlying the dielectric layer 38.

Figure 2:
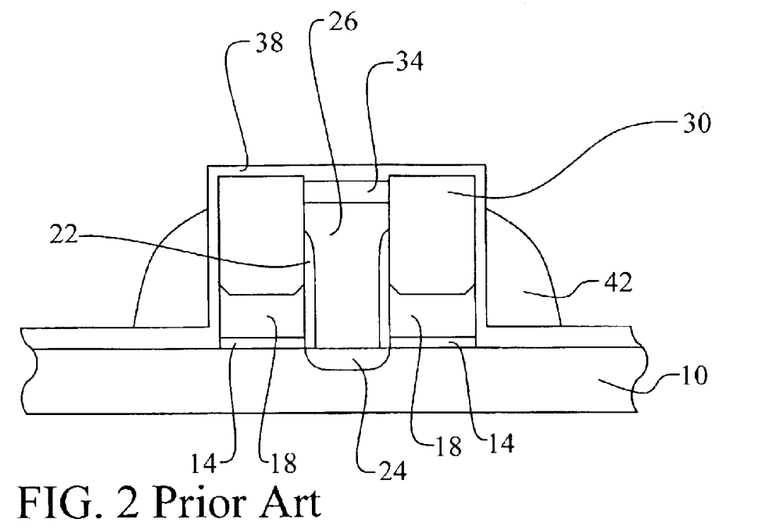

Referring now to FIG. 2, the second polysilicon layer 42 is then anisotropically etched to form spacers on the vertical surfaces of the dielectric layer 38. This technique forms word line gates 42 and 38 that overlie the substrate 10 to thereby control a channel region of the substrate 10. In addition, the word line gates 42 and 38 are adjacent to the floating gates 18 and 14 so that the word line gates can couple voltage onto the floating gates for programming cell states. This technique is particularly useful for fabricating flash memory cells since it does not require a masking step. Therefore, the flash cell size can be shrunk independently with respect to the word line feature.

Figure 3:
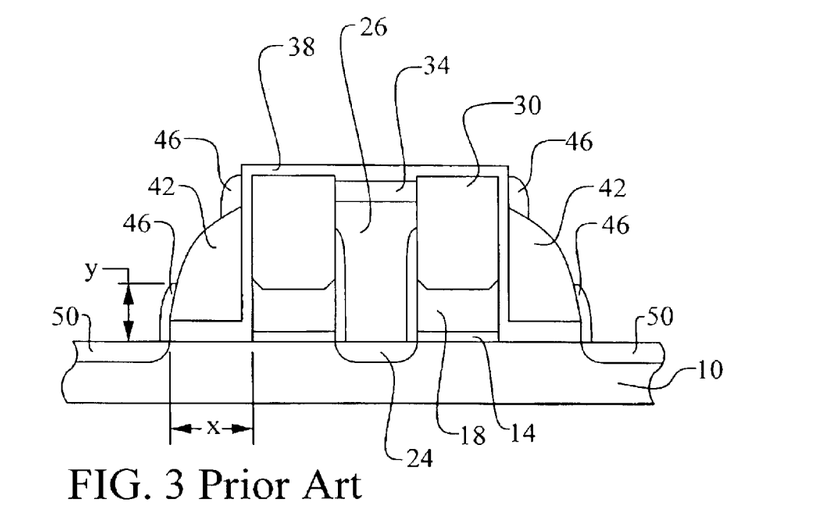

Referring now to FIG. 3, in a subsequent processing step, dielectric spacers 46 are formed on the side wall surfaces of the word line gates 42 and 38. These dielectric spacers 46 are used to facilitate a self-aligned silicide (salicide) process. It is desirable to form a metal silicide on the word line gate conductor 42 and on drain side bit lines 50 to reduce parasitic resistance. In a salicide process, a metal film is deposited overlying the wafer surface. A high temperature anneal is then performed. During the anneal process, the metal will react with any silicon or polysilicon that is in contact with the metal to form a metal silicide film. Following the anneal, the unreacted metal film is removed.

Figure 4:
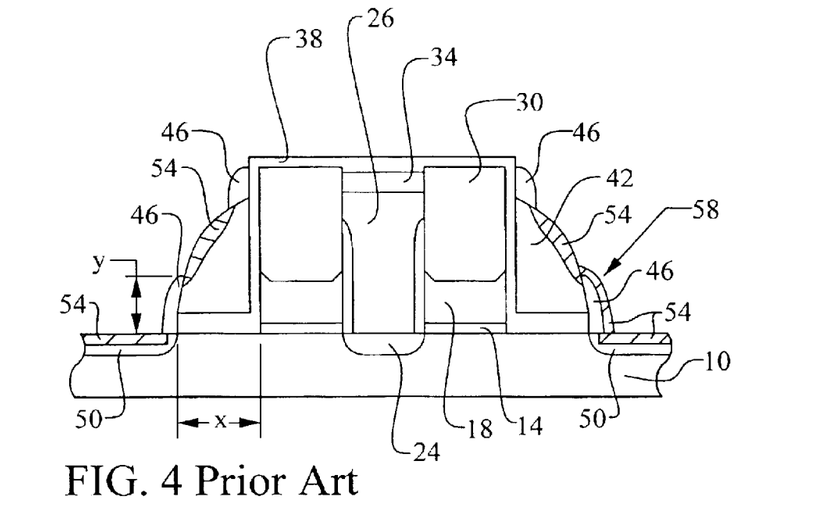

Referring now to FIG. 4, the resulting metal silicide film 54 is shown formed on the word line conductor 42 and on the drain bit lines 50. Note that a silicide short 58 is also illustrated. A silicide short 58 occurs when the dielectric spacers 46 that separate polysilicon 42 and silicon areas 10 are too small. In this case, the lower spacers 46 have a height Y.

In the prior art example, there are two significant problems. First, the word line gate conductors 42 are formed as spacers on the vertical side wall of the dielectric layer 38 as described above. However, it is not easy to control the channel length X of the word line transistor 42 and 38 using this method. This is especially true due to variations in the heights of shallow trench isolations (STI) across the integrated circuit wafer. These variations in STI height make it necessary to over etch the second polysilicon during the formation of the word line spacers 42 to insure that there is no residue. However, this over etch directly impacts the width X of the word line channel.

The second problem is the aforementioned silicide shorting, or bridging. If the dielectric spacer 46 has inadequate height Y or width, then bridging 58 will occur. Further, a low profile of the word line spacer 42 increases the problem of forming adequate dielectric spacers 46. It is difficult to resolve this problem to achieve consistent process results.

Several prior art inventions relate to split gate flash devices. U.S. Pat. No. 6,312,989 B1 to Hsieh et al discloses a split gate flash memory cell having a source plug and word lines comprising polysilicon spacers. U.S. Pat. No. 6,271,088 B1 to Liu et al teaches a method to form a buried, vertical split gate memory device. U.S. Pat. No. 6,204,126 B1 to Hsieh et al discloses a split gate flash cell formed with word line spacers. U.S. Pat. No. 6,143,606 to Wang et al shows a split gate flash memory cell.

SUMMARY OF THE INVENTION

A principal object of the present invention is to provide an effective and very manufacturable method to form split gate flash memory cells and a novel split gate flash memory cell device in an integrated circuit device.

A further object of the present invention is to provide a method to form split gate memory cells with word line spacers having improved width control.

A yet further object of the present invention is to provide a method having improved salicide capability.

A yet further object of the present invention is to provide a method that does not require a masking level for defining the word line spacers.

A further object of the present invention is to provide a split gate device having improved word line width control.

A yet further object of the present invention is to provide a split gate device having improved salicide capability.

In accordance with the objects of this invention, a method to form split gate flash memory cells in the manufacture of an integrated circuit device is achieved. The method comprises providing a substrate. Pairs of floating gates are formed overlying the substrate. Common source plugs are formed overlying the substrate and filling spaces between the floating gate pairs. An oxide layer is formed overlying the substrate, the floating gates, and the common source plugs. A conductor layer is deposited overlying the oxide layer. First dielectric spacers are formed on vertical surfaces of the conductor layer. The conductor layer is etched through where not covered by the first dielectric spacers to thereby form word line gates adjacent to the floating gates. Second dielectric spacers are formed on vertical surfaces of the word line gates and the first dielectric spacers to complete the split gate flash memory cells.

Also in accordance with the objects of this invention, a split gate flash memory cell device is achieved. The device comprises a substrate. A pair of floating gates overlies the substrate. A common source plug overlies the substrate and filling spaces between the floating gate pair. A pair of word line gates each comprises, first, a polysilicon layer overlying the substrate and adjacent to one of the floating gates with an oxide layer therebetween. Second, a first dielectric spacer is on a vertical surface of the polysilicon layer. Finally, a second dielectric spacer is on a vertical surface of the polysilicon layer and of the first dielectric spacer. A pair of bit line drains is self-aligned to the word line gates.

In the accompanying drawings forming a material part of this description, there is shown.

DESCRIPTION OF THE PREFERRED EMBODIMENTS

The preferred embodiments of the present invention disclose a method to form a split gate device. The method improves the width control and the salicide capability of the word line spacer-gates. A new split gate device is disclosed. It should be clear to those experienced in the art that the present invention can be applied and extended without deviating from the scope of the present invention.

Figure 5:
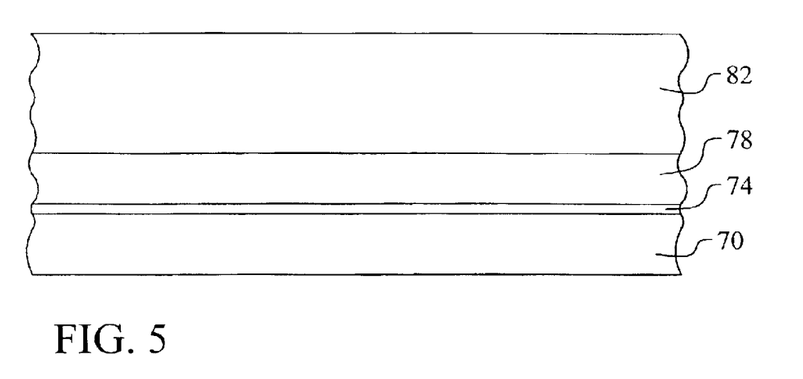
FIGS. 5 through 20 illustrate a preferred embodiment of the present invention showing a method to form a novel, split gate flash memory device.

Referring now to FIG. 5, the preferred embodiment of the present invention is illustrated. Several important features of the present invention are shown and discussed below. The cross section shows a partially completed, split gate flash memory cell. As in the prior art, the memory cell comprises a pair of flash transistors that share a common source.

A substrate 70 is provided. The substrate preferably comprises a semiconductor material. For example, monocrystalline silicon may be used for the substrate 70. A floating gate oxide 74 is formed overlying the substrate 70. Preferably, the floating gate oxide 74 is formed by growing a silicon oxide layer using thermal oxidation. The floating gate oxide layer 74 is preferably between about 70 Angstroms and 120 Angstroms in thickness. The floating gate oxide layer 74 is formed relatively thin to allow charge transfer, during programming or erasing, between the subsequently formed floating gate and the substrate 70. Yet, the floating gate oxide layer 74 is thick enough to provide excellent charge retention during non-programming and non-erasing operation.

A first polysilicon layer 78 is deposited overlying the floating gate oxide layer 74. The first polysilicon layer 78 is used to form the electrode for the floating gates. The first polysilicon layer 78 may be deposited using, for example, low-pressure chemical vapor deposition (LPCVD). The first polysilicon layer is preferably deposited to a thickness of between about 500 Angstroms and 1,200 Angstroms. At this point, shallow trench isolation (STI) regions, not shown, may be formed to define active areas for the flash split gate devices and to allow the cell diffusions to be self-aligned. This is not an important feature of the present invention, however.

A silicon nitride layer 82 is next deposited overlying the first polysilicon layer 78. The silicon nitride layer 82 defines the height of the flash cell device. The silicon nitride layer 82 is preferably deposited by CVD. The silicon nitride layer 82 is preferably deposited to a thickness of between about 2,500 Angstroms and 4,000 Angstroms.

Figure 6:
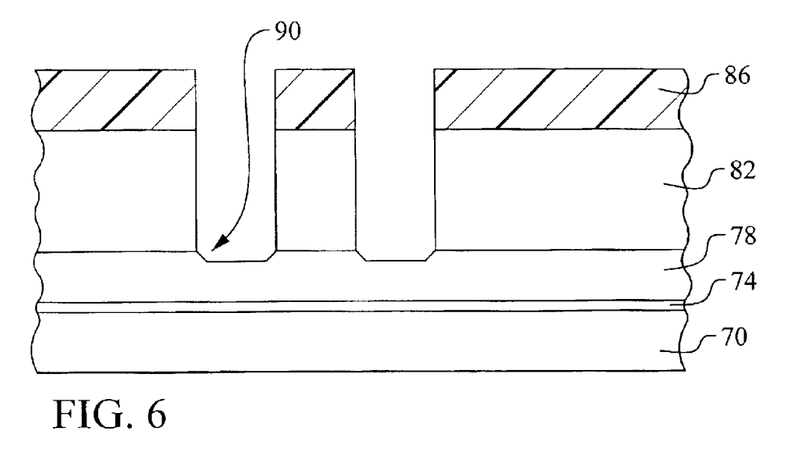

Referring now to FIG. 6, the silicon nitride layer 82 is patterned using a photoresist layer 86. To achieve the patterning, for example, the photoresist layer 86 is deposited overlying the silicon nitride layer 82. The photoresist layer 86 is exposed to actinic light through a reticle and then developed to reveal a pattern as shown. The silicon nitride layer 82 is then etched through using the photoresist layer 86 as a mask. An optional additional step in the method and feature in the device of the present invention is also disclosed. Following the etch through of the silicon nitride layer 82, the first polysilicon layer 78 may then be etched to create the sloped profile 90 shown. This step will form tips on the tops of the subsequently completed, floating gates. These tips 90 will improve the split gate flash cell performance by enhancing programming/erasing capability. If this additional etching is not performed, then the floating gate will have a flat top.

Figure 7:
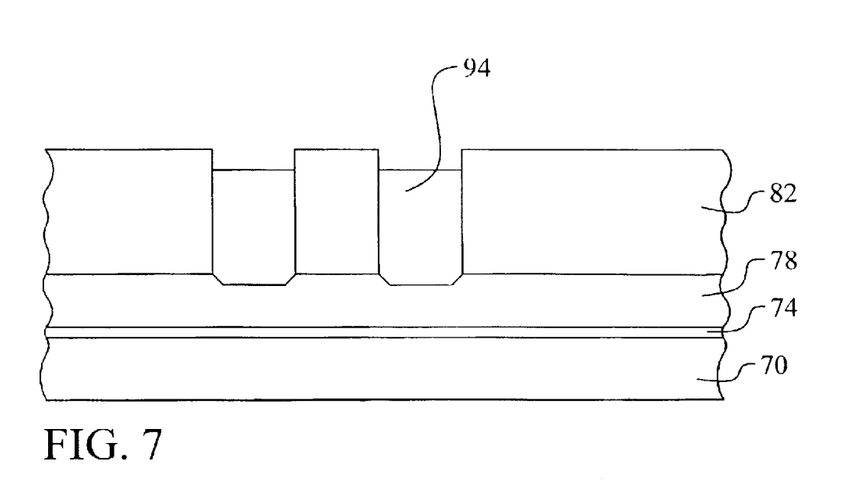

Referring now to FIG. 7, the photoresist mask 86 is removed. The trenches formed in the silicon nitride layer 82 are then filled with a second oxide layer 94. This second oxide layer is deposited overlying the silicon nitride layer 82 and the exposed first polysilicon layer 78 using, for example, a CVD process. The topmost layer of the second oxide layer 94 is then removed to confine the remaining oxide 94 to the trenches as shown. The preferred method is to remove the excess second oxide layer 94 using a chemical mechanical polish (CMP) process. Following the CMP step, the top of the second oxide layer 94 is preferably below the top of the silicon nitride layer 82 as shown.

Figure 8:
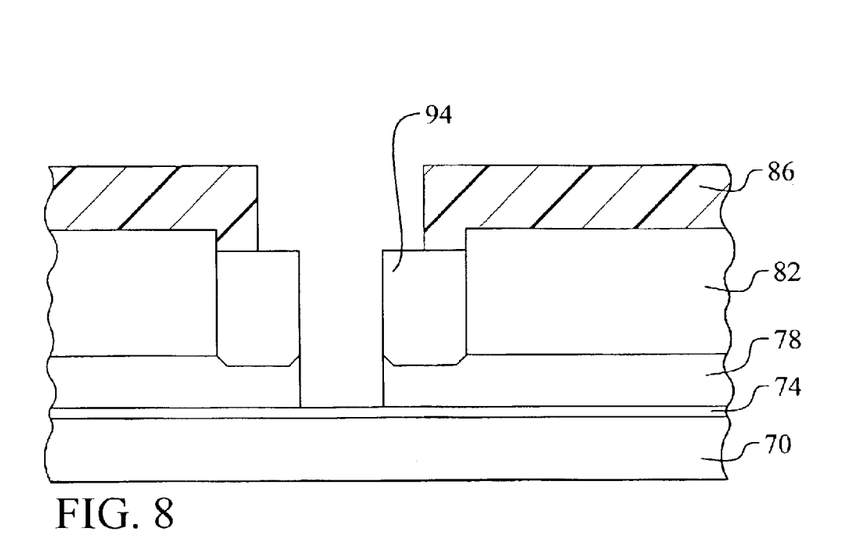

Referring now to FIG. 8, the common source area is now defined. The silicon nitride layer 82 is removed in the area between the trenches filled with second oxide layer 94. To accomplish this selective removal of the silicon nitride layer 82, a masking layer is defined. For example, a second photoresist layer 98 is deposited overlying the silicon nitride layer 82 and the second oxide layer 94. This second photoresist layer may be defined as described above. Note that the masking layer 98 may overlap onto the second oxide layer 94 since etching selectivity between oxide and nitride can be used to selectively remove only the nitride.

Figure 9:
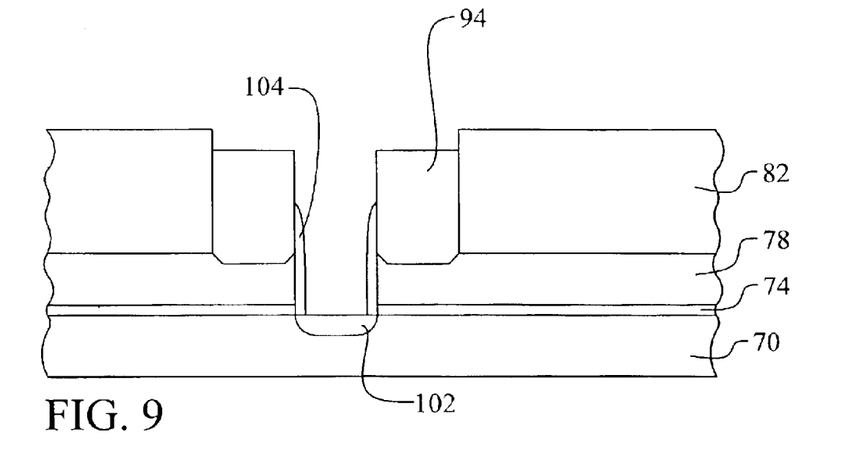

Referring now to FIG. 9, the common source 102 for the transistor pair is defined. The source region 102 is preferably formed using an ion implantation step. Following source 102 definition, a third oxide layer 104 is deposited. This third oxide layer 104 comprises a thin film of between about 200 Angstroms and 500 Angstroms that is conformally deposited overlying the wafer and lining the common source opening. The third oxide layer 104 is then etched back to form the spacers 104 shown. The spacers 104 are used to isolate the subsequently formed, source plug from the floating gate 78. Note that this etching back also removes any oxide from the substrate surface in the exposed source 102.

Figure 10:
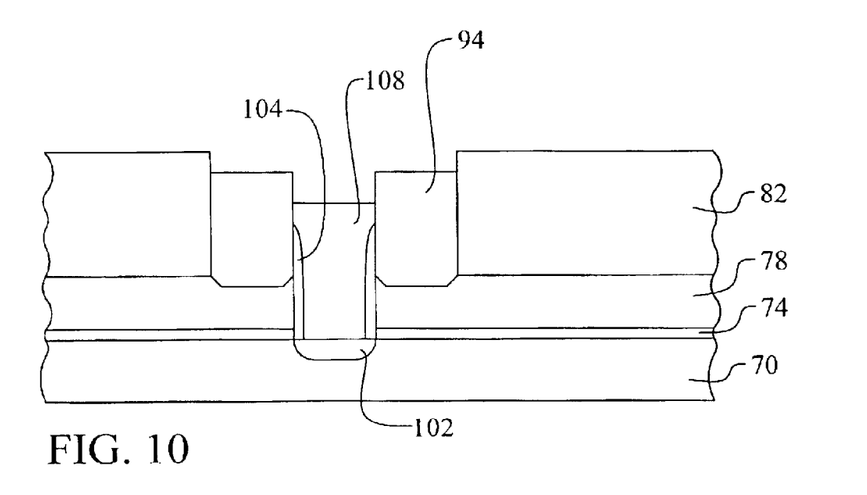

Referring now to FIG. 10, the source plug 108 is now formed 108. To form the plug 108, a second polysilicon layer 108 is deposited overlying the silicon nitride layer 82, the second oxide layer 94, and filling the common source trench. Preferably, the second polysilicon layer 108 is deposited using an LP CVD process. The second polysilicon layer 108 is preferably deposited to a thickness of between about 2,000 Angstroms and 5,000 Angstroms. Following deposition, excess polysilicon 108 is then removed to confine the plug 108 to the source trench. Preferably, this excess polysilicon 108 is removed using a CMP step. The presence of the source plug 108 is important to the present method and device because it facilitates the formation of the word line gates using an etch back process that does not require a masking step.

Figure 11:
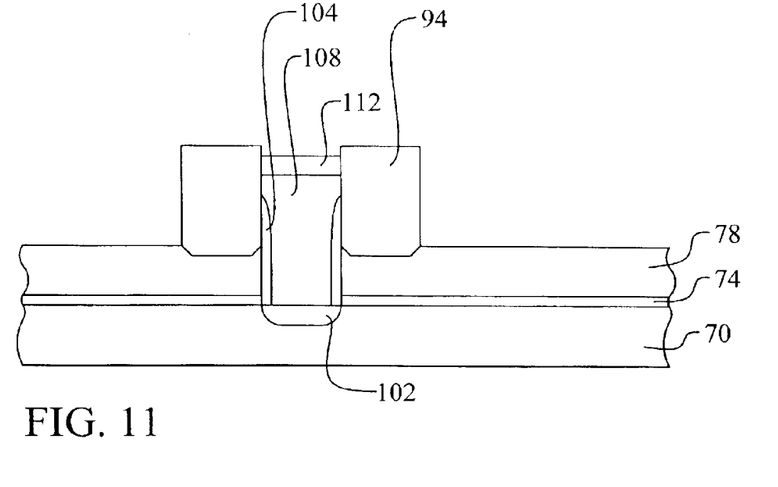

Referring now to FIG. 11, at this point, the second polysilicon layer 108 is oxidized to form a fourth oxide layer 112 overlying the source plug 108. The fourth oxide layer is preferably formed by thermal oxidation to a thickness of between about 200 Angstroms and 500 Angstroms. The silicon nitride layer 82 is then removed to expose the first polysilicon layer 78.

Figure 12:
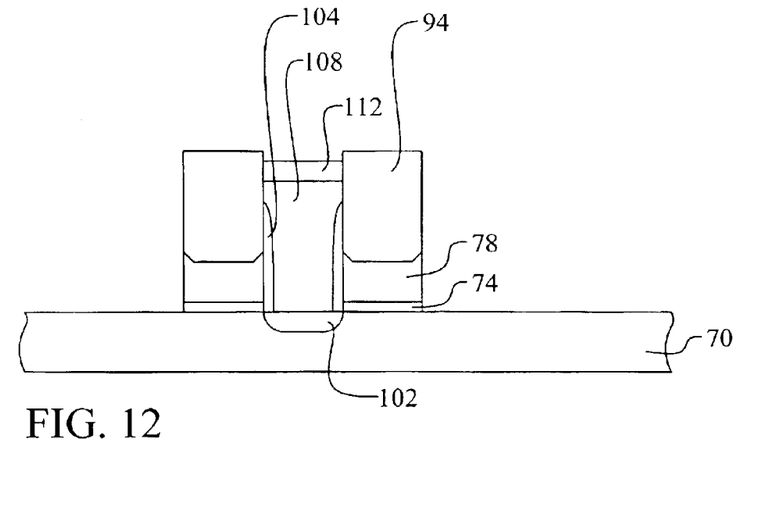

Referring now to FIG. 12, the first polysilicon layer 78 and the floating gate oxide layer 74 are etched through where exposed. This step completes formation of the floating gates 78 and 74 of the split gate flash cell.

Figure 13:
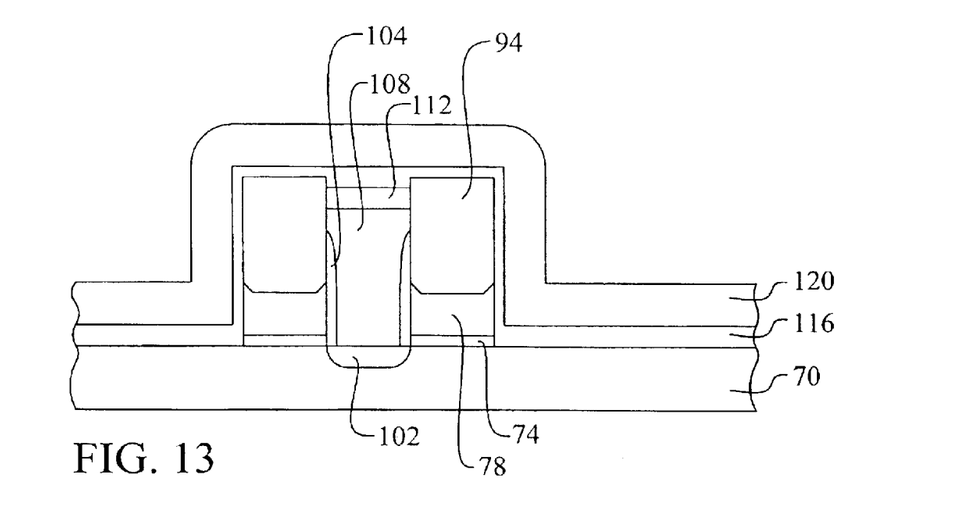

Referring now to FIG. 13, an important step in the method and feature of the device of the present invention is illustrated. A fifth oxide layer 116 is formed overlying the floating gates 78 and 74, the second oxide layer 94, the fourth oxide layer 112, and the substrate 70. The fifth oxide layer 116 is the key dielectric boundary between the floating gate electrode 78 and the subsequently formed, word line electrode. The fifth oxide layer 116 is preferably formed by a CVD process to a thickness of between about 120 Angstroms and 250 Angstroms.

A third polysilicon layer 120 is then deposited overlying the fifth oxide layer 116. The third polysilicon layer 120 will become the word line electrodes for the flash cells. The third polysilicon layer 120 is preferably deposited using, for example, LP CVD. The third polysilicon layer 120 is preferably deposited to a thickness of between about 1,000 Angstroms and 4,000 Angstroms.

Figure 14:
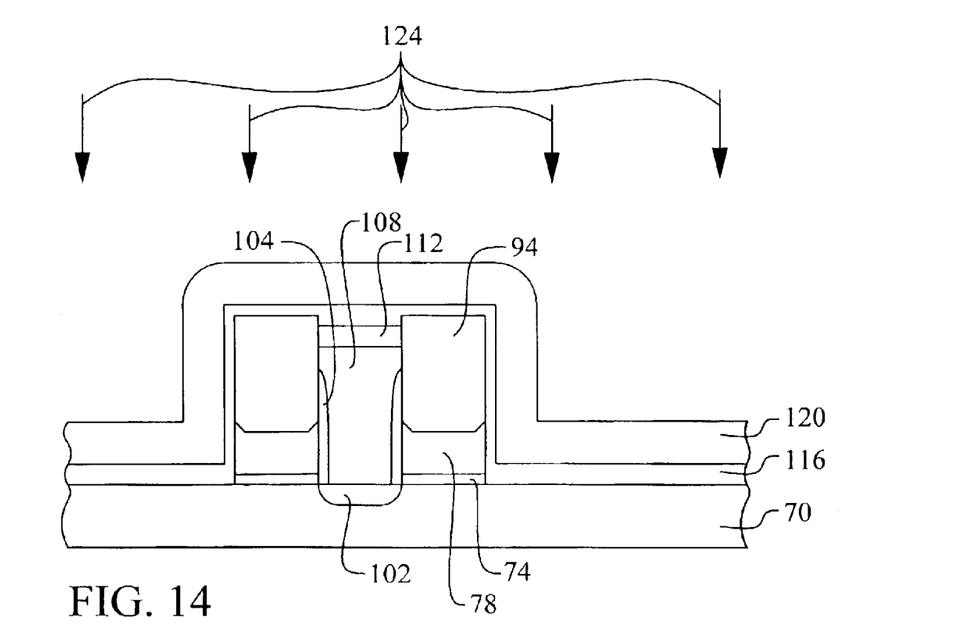

Referring now to FIG. 14, an optional step in the method is illustrated. If the third polysilicon layer 120 is of high resistivity, it may be necessary to dope the polysilicon to lower the resistivity. In this case, ions are implanted 124 into the third polysilicon layer 120. It is important to perform this ion implantation step 124 prior to the formation of the dual dielectric spacers so that implantation is not partially blocked by the presence of the spacers. For example, arsenic ions may be implanted at an energy of between about 10 KeV and about 50 KeV and a dose of between about $1 \times 10^{15}$ atoms/cm$^2$ and about $8 \times 10^{15}$ atoms/cm$^2$.

Figure 15:
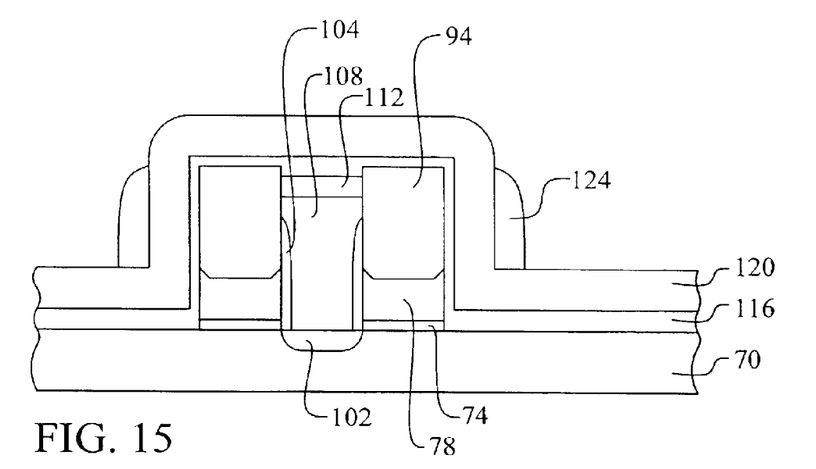

Referring now to FIG. 15, an important step in the method and feature in the device of the present invention is illustrated. A first dielectric layer 124 is deposited overlying the third polysilicon layer 120. The first dielectric layer 124 is then etched back, stopping on the third polysilicon layer 120, to form spacers 124 on the vertical surfaces of the third polysilicon layer 120. The first dielectric layer 124 preferably comprises an oxide film deposited by a TEOS CVD or HTO. Alternatively, the first dielectric layer may comprise silicon nitride deposited by CVD. The combined thickness of the first dielectric layer 124 and the third polysilicon layer 120 is carefully controlled. After the etching down of the first dielectric layer 124, the width of the combined layers 120 and 124 will establish the width of the word line transistors. The first dielectric layer 124 is preferably deposited to a thickness of between about 500 Angstroms and 2,000 Angstroms.

Figure 16:
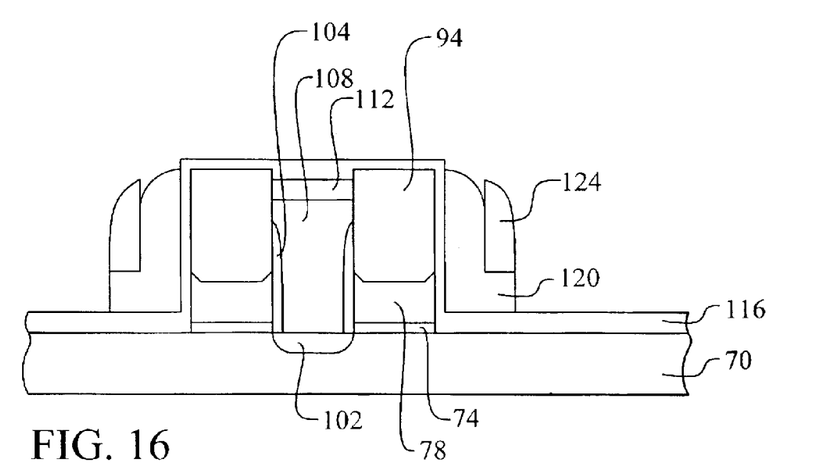

Referring now to FIG. 16, another key feature of the present invention is illustrated. The third polysilicon layer 120 is etched down. This etching down will etch through to the fifth oxide layer 116, where exposed by the first dielectric layer 124, and will reduce the topmost portion of the third polysilicon layer. An L-shaped spacer is thereby formed in the third polysilicon layer 120 as shown. It is important to note that word line gates 120 are thereby formed on each side of the flash cell. The word line gates 120 are adjacent to the side walls of the floating gates 78 with the fifth oxide layer 116 therebetween. In addition, the word line gates 120 overlie the substrate 70 with the fifth oxide layer 116 therebetween. In this way, a pair of split gate flash devices are formed on each side of the common source 102.

It is also important to note that the L-shaped, word line gates 120 are defined without using a masking step. The combined thickness of the third polysilicon layer 120 and the first dielectric layer 124 is used to define the word line transistor length. The unique, L-shaped word lines 120 are thereby formed self-aligned to the floating gates 78 without the requirement of an additional mask. Excellent control of the word line transistor length is attained because it depends on the film thicknesses of the third polysilicon layer 120 and the first dielectric layer 124.

Figure 17:
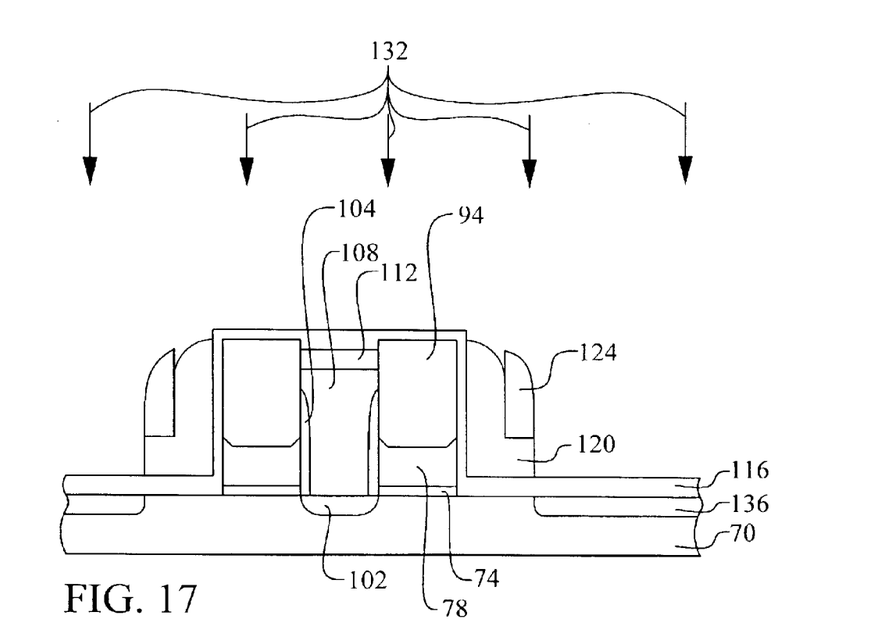

Referring now to FIG. 17, an optional step in processing is illustrated. Ions are implanted 132 into the substrate 70 to form bit line drain regions 136 for the flash cells. The uniquely defined device of the present invention allows the drain regions 136 to be formed self-aligned to the word lines 120 without the use of a mask.

Figure 18:
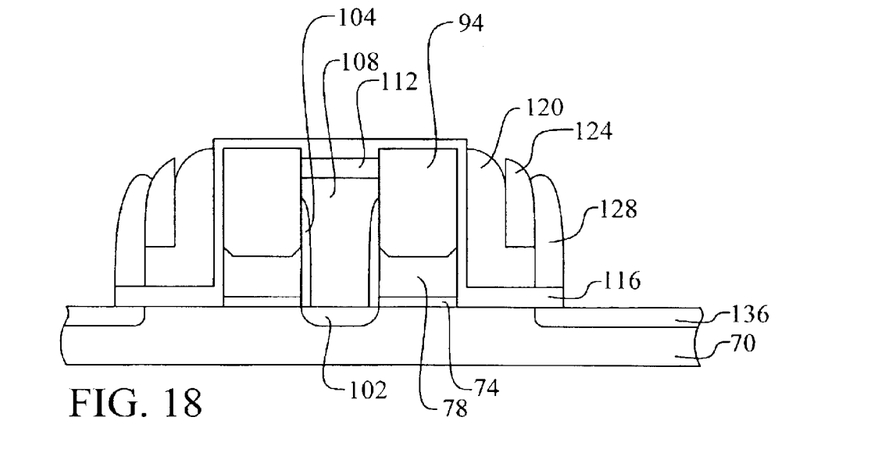

Referring now to FIG. 18, another important feature in the present invention is disclosed. A second dielectric layer 128 is deposited overlying the word line gates 120, the first dielectric layer 124, and the fifth oxide layer 116. The second dielectric layer 128 is then etched back to form second dielectric spacers 128 on the vertical surfaces of the first dielectric layer 124 and the word line gates 120. The second dielectric layer 128 preferably comprises an oxide film deposited by a TEOS CVD or HTO. Alternatively, the second dielectric layer may comprise silicon nitride deposited by CVD. The second dielectric layer 128 is preferably deposited to a thickness of between about 1,000 Angstroms and 3,000 Angstroms. The fifth oxide layer 116 may be etched through during the etching back of the second dielectric layer 128. The second dielectric spacers 128 provide isolating regions between the drain regions 136 and the word line polysilicon 120. This is a critical feature of the method and device to insure that the self-aligned silicide (salicide) process is manufacturable.

Figure 19:
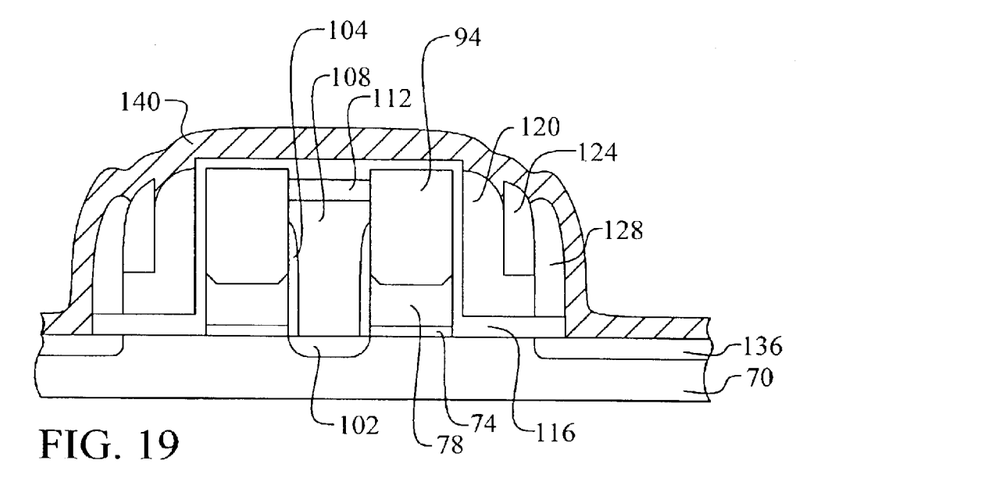

Referring now to FIG. 19, a further step in the method is shown. As a first step in forming metal silicide, a metal layer 140 is deposited overlying the substrate 70, word lines 120, spacers 124 and 128, and fifth dielectric layer 116. A high temperature anneal is then performed to increase the reaction rate of the metal 140 with the underlying polysilicon 120 and silicon 136 regions.

Figure 20:
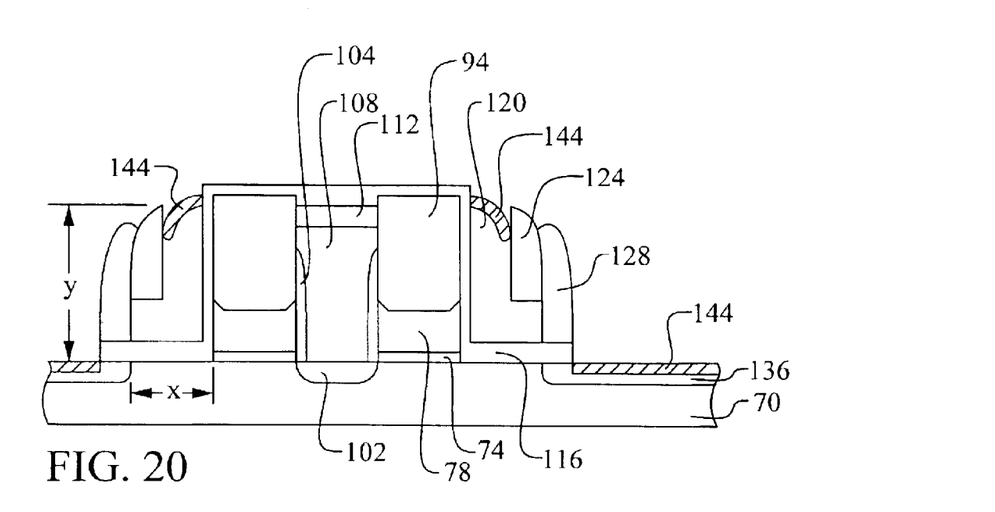

Referring now to FIG. 20, following the anneal, the unreacted metal 140 is removed. Metal silicide regions 144 are shown as forming in the second polysilicon layer 120 and in the drains 136. These metal silicide regions 144 reduce the drain and gate resistance of the completed devices. Note that the presence of the double spacers 124 and 128 prevents any silicide bridging from the drains 136 to the word line gates 120.

The final device combines two distinct advantages. First, the word line channel width X is defined only by the thickness of the deposited third polysilicon layer 120 and first dielectric layer 124. This feature allows for much tighter control over the word line channel width X for the process. Second, the use of a double spacer scheme creates a large gap Y between the silicide regions 144 formed on the drain 136 and on the word line gate 120. The potential for silicide bridging is thereby greatly reduced.

The advantages of the present invention may now be summarized. An effective and very manufacturable method to form split gate flash memory cells is achieved. A novel split gate flash memory cell device is achieved. The method to form split gate memory cells with word line spacers has improved width control and salicide capability. The method does not require a masking level for defining the word line spacers. The split gate device has improved word line width control and salicide capability.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form split gate flash memory cells in the manufacture of an integrated circuit device comprising:
   providing a substrate;
   forming a pairs of floating gates overlying said substrate;
   forming common source plugs overlying said substrate and filling spaces between said floating gate pairs;
   forming an oxide layer overlying said substrate, said floating gates, and said common source plugs;
   depositing a conductor layer overlying said oxide layer;
   forming first dielectric spacers on vertical surfaces of said conductor layer;
   thereafter etching through said conductor layer where not covered by said first dielectric spacers to thereby form word line gates adjacent to said floating gates; and
   forming second dielectric spacers on vertical surfaces of said word line gates and said first dielectric spacers to complete said split gate flash memory cells.

2. The method according to claim 1 wherein said conductor layer comprises polysilicon.

3. The method according to claim 2 further comprising implanting ions into said conductor layer prior to said step of forming first dielectric spacers.

4. The method according to claim 1 wherein said floating gates have tips adjacent to said word line gates.

5. The method according to claim 1 further comprising implanting ions into said substrate to form bit line drains self-aligned to said word line gates.

6. The method according to claim 5 further comprising:
   depositing a metal layer overlying said word line gates, said bit line drains, said first dielectric spacers, said second dielectric spacers, and said oxide layer;
   annealing said metal layer to form silicide regions on said word line gates and said bit line drains; and
   thereafter removing unreacted said metal layer.

7. The method according to claim 1 wherein said first dielectric spacers comprise one of the group consisting of: oxide and nitride.

8. The method according to claim 1 wherein said second dielectric spacers comprise one of the group consisting of: oxide and nitride.

9. A method to form split gate flash memory cells in the manufacture of an integrated circuit device comprising:
   providing a substrate;
   forming a pairs of floating gates overlying said substrate;
   forming common source plugs overlying said substrate and filling spaces between said floating gate pairs;
   forming an oxide layer overlying said substrate, said floating gates, and said common source plugs;
   depositing a polysilicon layer overlying said oxide layer;
   forming first dielectric spacers on vertical surfaces of said conductor layer;
   thereafter etching through said conductor layer where not covered by said first dielectric spacers to thereby form word line gates adjacent to said floating gates; and
   implanting ions into said substrate to form bit line drains self-aligned to said word line gates;
   forming second dielectric spacers on vertical surfaces of said word line gates and said first dielectric spacers;
   depositing a metal layer overlying said word line gates, said bit line drains, said first dielectric spacers, said second dielectric spacers, and said oxide layer;
   annealing said metal layer to form silicide regions on said word line gates and said bit line drains; and
   thereafter removing unreacted said metal layer to complete said split gate flash memory cells.

10. The method according to claim 9 further comprising implanting ions into said polysilicon layer prior to said step of forming first dielectric spacers.

11. The method according to claim 9 wherein said floating gates have tips adjacent to said word line gates.

12. The method according to claim 9 wherein said first dielectric spacers comprise one of the group consisting of: oxide and nitride.

13. The method according to claim 9 wherein said second dielectric spacers comprise one of the group consisting of: oxide and nitride.

14. A split gate flash memory cell device comprising:
   a substrate;
   a pair of floating gates overlying said substrate;
   a common source plug overlying said substrate and filling spaces between said floating gate pair;
   a pair of word line gates each comprising:
      a polysilicon layer overlying said substrate and adjacent to one of said floating gates with an oxide layer therebetween;
      a first dielectric spacer on a vertical surface of said polysilicon layer; and
      a second dielectric spacer on a vertical surface of said polysilicon layer and of said first dielectric spacer; and
   a pair of bit line drains self-aligned to said word line gates.

15. The device according to claim 14 wherein said conductor layer comprises polysilicon.

16. The device according to claim 15 wherein said polysilicon is doped.

17. The method according to claim 14 wherein said floating gates have tips adjacent to said word line gates.

18. The device according to claim 14 further comprising silicide regions on said word line gates and said bit line drains.

19. The device according to claim 14 wherein said first dielectric spacers comprise one of the group consisting of: oxide and nitride.

20. The device according to claim 14 wherein said second dielectric spacers comprise one of the group consisting of: oxide and nitride.

* * * * *